US012598916B2

(12) United States Patent
van der Straten et al.

(10) Patent No.: US 12,598,916 B2
(45) Date of Patent: Apr. 7, 2026

(54) MRAM DEVICE WITH SELF-ALIGNED BOTTOM ELECTRODES

(71) Applicant: INTERNATIONAL BUSINESS MACHINES CORPORATION, Armonk, NY (US)

(72) Inventors: Oscar van der Straten, Guilderland Center, NY (US); Lisamarie White, Chapin, SC (US); Willie Lester Muchrison, Jr., Troy, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 931 days.

(21) Appl. No.: 17/808,561

(22) Filed: Jun. 24, 2022

(65) Prior Publication Data

US 2023/0422629 A1     Dec. 28, 2023

(51) Int. Cl.
| | |
|---|---|
| *H10N 50/01* | (2023.01) |
| *G11C 11/16* | (2006.01) |
| *H10B 61/00* | (2023.01) |
| *H10N 50/10* | (2023.01) |
| *H10N 50/80* | (2023.01) |
| *H10N 50/85* | (2023.01) |

(52) U.S. Cl.
CPC .......... *H10N 50/01* (2023.02); *G11C 11/161* (2013.01); *H10B 61/00* (2023.02); *H10N 50/10* (2023.02); *H10N 50/80* (2023.02); *H10N 50/85* (2023.02)

(58) Field of Classification Search
CPC ........ H10N 50/01; H10N 50/80; H10N 50/85; H10N 50/10; H10B 61/00; G11C 11/161

USPC .......................................................... 257/640
See application file for complete search history.

(56) References Cited

U.S. PATENT DOCUMENTS

| | | | |
|---|---|---|---|
| 9,166,154 | B2 | 10/2015 | Satoh |
| 9,564,582 | B2 | 2/2017 | Pakala |
| 10,069,064 | B1 | 9/2018 | Haq |
| 10,483,460 | B2 | 11/2019 | Nagel |
| 10,770,652 | B2 | 9/2020 | Marchack |
| 2010/0311243 | A1 | 12/2010 | Mao |
| 2011/0049655 | A1 | 3/2011 | Assefa |
| 2011/0133300 | A1 | 6/2011 | Xiao |

(Continued)

FOREIGN PATENT DOCUMENTS

EP           3472875 B1    10/2020

*Primary Examiner* — Igwe U Anya
(74) *Attorney, Agent, or Firm* — L. Jeffrey Kelly

(57) ABSTRACT

A magnetic tunnel junction (MTJ) stack, where a vertical side surface of a bottom electrode of the MTJ stack is surrounded by an oxide, where the bottom electrode and the oxide are horizontally aligned. A magnetic tunnel junction (MTJ) stack, where a vertical side surface of a bottom electrode of the MTJ stack and a metal spacer below the bottom electrode is surrounded by an oxide, where an upper surface of the bottom electrode is horizontally aligned with a horizontal upper surface of the oxide, where a lower surface of the metal spacer is horizontally aligned with a horizontal lower surface of the oxide. Forming a metal spacer above and vertically aligned with a lower metal line surrounded by a dielectric, and forming a metal layer on the metal spacer and dielectric with a high temperature deposition of the metal layer, where the metal layer oxidizes.

20 Claims, 30 Drawing Sheets

100

(56)  References Cited

U.S. PATENT DOCUMENTS

| | | | |
|---|---|---|---|
| 2015/0380302 A1* | 12/2015 | Mountsier | H01L 21/76814 |
| | | | 438/654 |
| 2016/0204340 A1* | 7/2016 | Kumura | H10N 50/10 |
| | | | 257/421 |
| 2019/0386210 A1* | 12/2019 | Rizzolo | H10N 50/80 |
| 2020/0235286 A1* | 7/2020 | Marchack | H10N 50/01 |
| 2021/0151668 A1 | 5/2021 | Yang | |
| 2021/0202830 A1 | 7/2021 | Hsu | |
| 2021/0217951 A1 | 7/2021 | Yang | |
| 2022/0190235 A1* | 6/2022 | van der Straten | H10B 61/00 |
| 2023/0189535 A1* | 6/2023 | van der Straten | H10N 50/01 |
| | | | 257/421 |
| 2023/0200086 A1* | 6/2023 | van der Straten | H10B 61/00 |
| | | | 257/421 |
| 2023/0263069 A1* | 8/2023 | Yang | H10N 50/01 |
| | | | 257/421 |

* cited by examiner

100

120

100

200

| 228 | 222 | 228 |
| 212 | 214 | 212 |
| 208 | | |
| 204 | | |

206

200

200

200

200

MRAM DEVICE WITH SELF-ALIGNED BOTTOM ELECTRODES

BACKGROUND

The present invention relates, generally, to the field of semiconductor manufacturing, and more particularly to fabricating a magnetic tunnel junction device with self-aligned bottom electrodes.

Magneto resistive random-access memory ("MRAM") devices are used as non-volatile computer memory. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit of memory.

SUMMARY

According to an embodiment of the present invention, a semiconductor device is provided. The semiconductor device including a magnetic tunnel junction (MTJ) stack, where a vertical side surface of a bottom electrode of the MTJ stack is surrounded by an oxide, where the bottom electrode and the oxide are horizontally aligned.

According to an embodiment of the present invention, a semiconductor device is provided. The semiconductor device including a magnetic tunnel junction (MTJ) stack, where a vertical side surface of a bottom electrode of the MTJ stack and a metal spacer below the bottom electrode is surrounded by an oxide, where an upper surface of the bottom electrode is horizontally aligned with a horizontal upper surface of the oxide, where a lower surface of the metal spacer is horizontally aligned with a horizontal lower surface of the oxide.

According to an embodiment of the present invention, a method is provided. The method including forming a metal spacer above and vertically aligned with a lower metal line surrounded by a dielectric, and forming a metal layer on the metal spacer and dielectric with a high temperature deposition of the metal layer, where the metal layer oxidizes.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
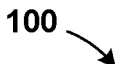
FIG. 1 illustrates a cross-sectional view of a multi-state memory cell, according to an exemplary embodiment.
Figure 1:
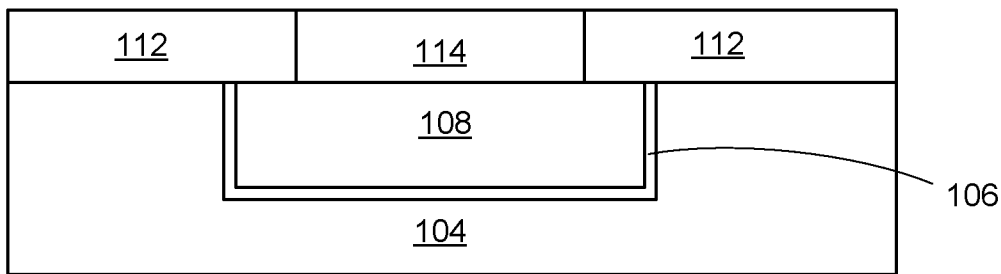

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, magneto resistive random-access memory (hereinafter "MRAM") devices are a non-volatile computer memory technology. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". The magnetic reference layer may be referred to as a reference layer, and the remaining layer may be referred to as a free layer. This configuration is known as the magnetic tunnel junction (hereinafter "MTJ") and is the simplest structure for a MRAM bit of memory.

A memory device is built from a grid of such memory cells or bits. In some configurations of MRAM, such as the type further discussed herein, the magnetization of the magnetic reference layer is fixed in one direction (up or down), and the direction of the magnetic free layer can be switched by external forces, such as an external magnetic field or a spin-transfer torque generating charge current. A smaller current (of either polarity) can be used to read resistance of the device, which depends on relative orientations of the magnetizations of the magnetic free layer and the magnetic reference layer. The resistance is typically higher which the magnetizations are anti-parallel and lower when they are parallel, though this can be reversed, depending on materials used in fabrication of the MRAM.

The MRAM stack layers may be conformally formed using known techniques. In formation of the MTJ stacks layers, the reference layer is formed on a dielectric and a bottom electrode. The tunneling barrier layer is formed on the reference layer. In an embodiment, the tunneling barrier layer is a barrier, such as a thin insulating layer or electric potential, between two electrically conducting materials. Electrons (or quasiparticles) pass through the tunneling barrier layer by the process of quantum tunneling. In certain embodiments, the tunneling barrier layer includes at least one sublayer composed of magnesium oxide (MgO). It should be appreciated that materials other than MgO can be used to form the tunneling barrier layer. The free layer is a magnetic free layer that is adjacent to tunneling barrier layer and opposite the reference layer. The free layer has a magnetic moment or magnetization that can be flipped. It should also be appreciated that the MTJ stack layers may include additional layers, omit certain layers, and each of the layers may include any number of sublayers. Moreover, the composition of layers and/or sublayers may be different between the different MRAM stacks.

For high performance MRAM devices based on perpendicular magnetic tunnel junction (MTJ) structures, well-defined interfaces and interface control are essential. MTJ structures typically include a cobalt (Co) based synthetic anti-ferromagnet (SAF), a CoFeB-based reference layer, a MgO-based tunnel barrier, a CoFeB-based free layer, and cap layers containing e.g. tantalum (Ta) and/or ruthenium (Ru). Embedded MTJ structures are usually formed by subtractive patterning of blanket MTJ stacks into pillars between two metal levels. In this invention, after MTJ stack patterning, inter-pillar spaces are filled with inter-layer dielectric (hereinafter "ILD") to enable connection to BEOL wiring by a top contact level.

The present invention relates to fabricating a MTJ device with a self-aligned bottom electrode.

High performance MRAM devices based on perpendicular magnetic tunnel junction (MTJ) structures require well-defined interfaces and interface control. A MTJ structure typically includes a Co-based synthetic anti-ferromagnet (SAF), a CoFeB-based reference layer, a MgO-based tunnel barrier, a CoFeB-based free layer, and cap layers containing e.g. Ta and/or Ru. Embedded MTJ structures are usually formed by patterning of blanket MTJ stacks, where each layer is conformally formed and the entire stack is patterned forming individual MTJ stacks. Using reactive ion etch (RIE), and ion beam etch (IBE) processing to pattern the blanket MTJ stacks presents a major challenge, as it typically leads to shorts due to re-sputtering of thick bottom metal layers, such as a bottom electrode, onto MTJ stack sidewalls. The shorts may form along the MTJ stack sidewalls between the bottom electrode, the reference layer, the tunnel barrier, the free layer and/or the top electrode.

There is a need for embedded MTJ structures formed by methods with a reduced risk of shorts due to metal re-sputtering.

Embodiments of the present invention include an MRAM device structure having a self-aligned bottom electrode, which is a metal layer underneath the MTJ stack or pillar, with a metal-oxide surrounding the metal layer to avoid metal re-sputtering of the metal layer. The bottom electrode may include titanium (Ti), tantalum (Ta) or niobium (Nb). The bottom electrode may be formed on a metal spacer, such as tantalum nitride (TaN) or tungsten nitride (WN). In an embodiment, a metal oxide layer, for example titanium oxide (TiOx) or titanium silicon oxide (TiSiOx) may be formed below the silicon nitride (SiN) layer. The silicon nitride (SiN) layer is referred to as the dielectric encapsulation layer in the description of the drawings.

In an embodiment, a metal cap may be formed over a lower metal wire and a dielectric oxide may surround the metal cap. A high temperature deposition of a metal layer of titanium (Ti) may cause portions of the metal layer to oxidize with the dielectric oxide, resulting in a bottom electrode over the metal cap and oxidized metal surrounding the metal cap. The oxidized metal may help to prevent re-sputtering of the bottom electrode during later process steps.

In an embodiment, layers of titanium (Ti) and silicon oxide (SiOx) may be transformed to a ternary oxide layer (TiSiOx), surrounding the bottom electrode by a high temperature anneal.

In an embodiment, portions of the oxidized bottom electrode material may be removed.

The title is self-aligned bottom electrodes. Self-aligned refers to a bottom electrode with the same lateral dimensions as a metal spacer below the bottom electrode.

Referring now to FIG. 1, a semiconductor structure 100 (hereinafter "structure") at an intermediate stage of fabrication is shown according to an exemplary embodiment. FIG. 1 is a cross-sectional view of the structure 100. The structure 100 may be formed or provided. The structure 100 includes, for example, an inter-layer dielectric (hereinafter "ILD") 104, a liner 106, a lower metal wire 108, a dielectric cap 112 and a metal cap 114.

The structure 100 may include several back end of line ("BEOL") layers. In general, the back end of line (BEOL) is the second portion of integrated circuit fabrication where the individual devices (transistors, capacitors, resistors, etc.) are interconnected with wiring on the wafer.

The ILD 104 may be formed by depositing or growing a dielectric material, followed by a chemical mechanical polishing (CMP) or etch steps. The ILD 104 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the ILD 104 may include one or more layers. In an embodiment, the ILD 104 may include any dielectric material such as silicon oxide (SiOx), silicon nitride (SiNx), silicon boron carbonitride (SiBCN), SiCN, a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material.

The lower metal wire 108 may be formed by first patterning a trench (not shown) into the ILD 104, lining the trench with the liner 106, and filling the trench.

The liner 106 separates the conductive interconnect material of the lower metal wire 108 from the ILD 104. The liner 106 may be composed of, for example, tantalum nitride (TaN), tantalum (Ta), titanium (Ti), titanium nitride (TiN), or a combination thereof. The liner 106 may be deposited utilizing a conventional deposition process such as, for example, CVD, plasma enhanced chemical vapor deposition (PECVD), PVD or ALD. The liner 106 may be 10 nm thick, although a thickness less than or greater than 10 nm may be acceptable. The liner 106 surround a lower horizontal surface and a vertical side surface of the lower metal wire 108.

In an embodiment, the lower metal wire 108 is formed from a conductive material layer which is blanket deposited on top of the structure 100, and directly on a top surface of the liner 106, filling the trench (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The lower metal wire 108 is formed by damascene, or patterned from the conductive material layer, using known patterning and etching techniques.

There may be any number of openings in the ILD 104, each filled with the liner 106 and the lower metal wire 108, on the structure 100.

A planarization process, such as, for example, chemical mechanical polishing (CMP), may be done to remove excess material from a top surface of the structure 100 such that upper horizontal surfaces of the lower metal wire 108, the liner 106 and the ILD 104 are coplanar.

In an embodiment, the lower metal wire 108 may have a thickness ranging from about 10 nm to about 100 nm, although a thickness less than 10 nm and greater than 100 nm may be acceptable.

The dielectric cap 112 may include, for example, silicon carbonitride (SiNC). The dielectric cap 112 may be deposited using typical deposition techniques, for example, physical vapor deposition, atomic layer deposition, molecular layer deposition, and chemical vapor deposition.

The metal cap 114 may be formed by first patterning an opening (not shown) into the dielectric cap 112, and filling the opening (not shown). The metal cap 114 may include materials such as, for example tantalum nitride (TaN) or tungsten nitride (WN). The metal cap 114 may be deposited using typical deposition techniques, for example, physical vapor deposition, atomic layer deposition, molecular layer deposition, and chemical vapor deposition. The metal cap 114 may be vertically aligned above the lower metal wire 108.

Figure 2:
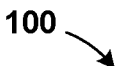
FIG. 2 illustrates a cross-sectional view of the multi-state memory cell and illustrates formation of a dielectric, according to an exemplary embodiment.
Figure 2:
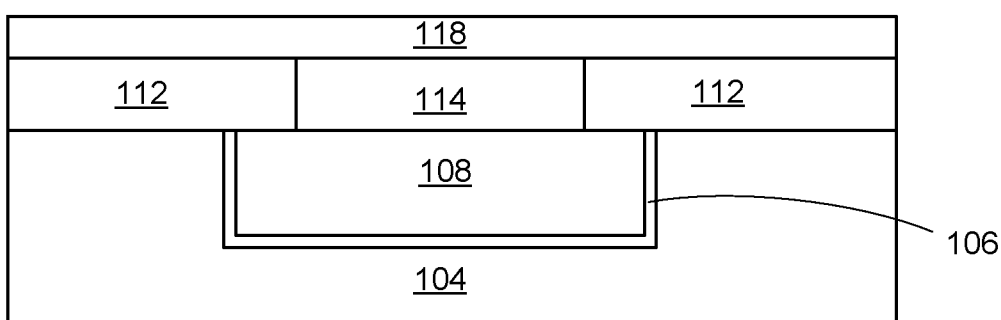

Referring now to FIG. 2, a cross-sectional view of the structure 100 is shown, according to an embodiment. A dielectric 118 may be formed.

The dielectric 118 may be conformally formed on the structure 100, covering the dielectric cap 112 and covering the metal cap 114.

The dielectric 118 may include, for example, silicon dioxide ($SiO_2$). The dielectric 118 may be deposited using typical deposition techniques, for example, physical vapor deposition, atomic layer deposition, molecular layer deposition, and chemical vapor deposition.

Figure 3:
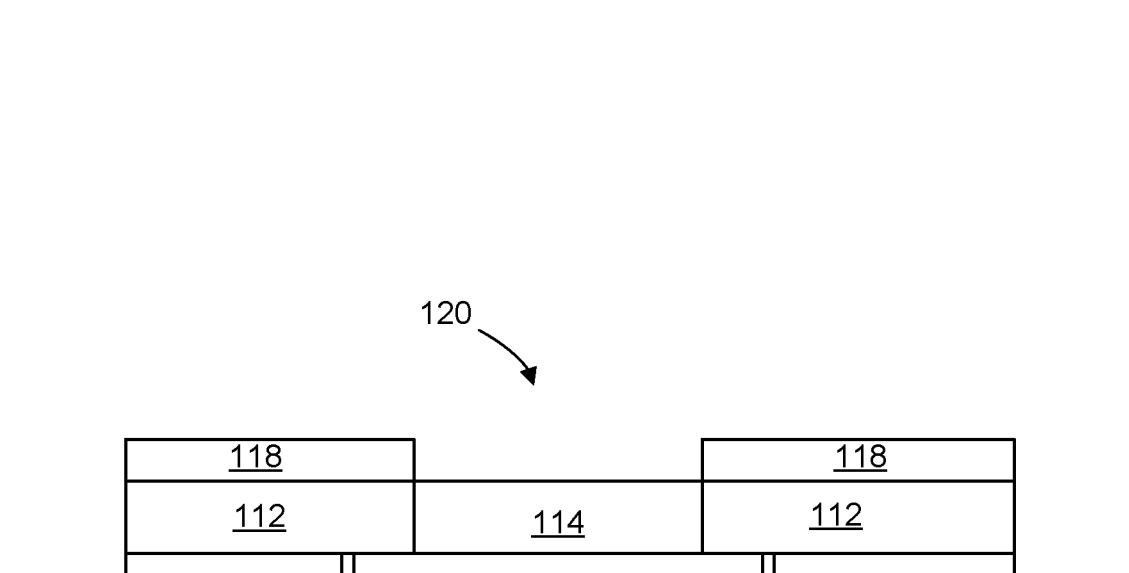
FIG. 3 illustrates a cross-sectional view of the multi-state memory cell and illustrates formation of an opening, according to an exemplary embodiment.

Referring now to FIG. 3, a cross-sectional view of the structure 100 is shown, according to an embodiment. An opening 120 may be formed.

The opening 120 may be formed using known patterning and etching techniques, removing a portion of the dielectric 118, exposing an upper horizontal surface of the metal cap 114.

Figure 4:
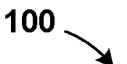
FIG. 4 illustrates a cross-sectional view of the multi-state memory cell and illustrates formation of a metal spacer, according to an exemplary embodiment.
Figure 4:
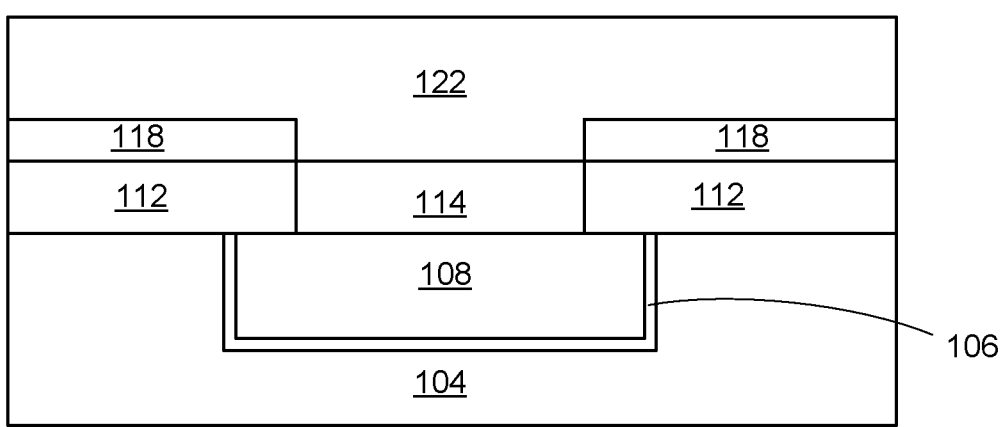

Referring now to FIG. 4, a cross-sectional view of the structure 100 is shown, according to an embodiment. A metal spacer 122 may be formed.

The metal spacer 122 may be formed conformally on the structure 100, on the upper horizontal surface of the metal cap 114, on vertical side surfaces and an upper horizontal surface of the dielectric 118 and fill the opening 120.

The metal spacer 122 may include, for example, tantalum nitride (TaN). The metal spacer 122 may be deposited using typical deposition techniques, for example, physical vapor deposition, atomic layer deposition, molecular layer deposition, and chemical vapor deposition.

Figure 5:
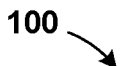
FIG. 5 illustrates a cross-sectional view of the multi-state memory cell and illustrates the metal spacer after metal overburden removal, according to an exemplary embodiment.
Figure 5:
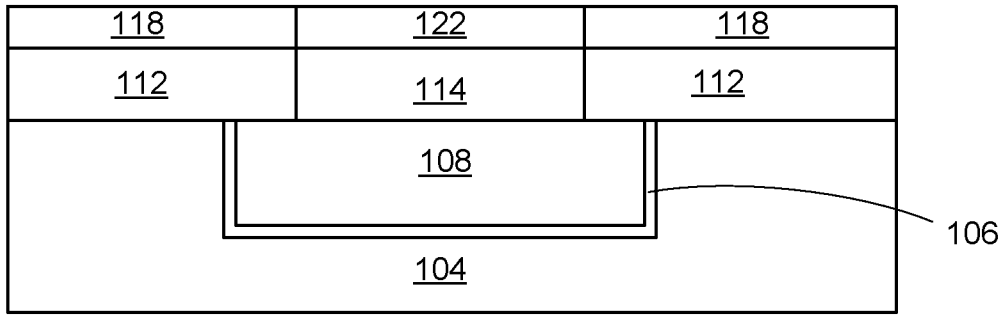

Referring now to FIG. 5, a cross-sectional view of the structure 100 is shown, according to an embodiment.

A chemical mechanical polishing (CMP) or etch steps may be performed to remove excess material from a top surface of the structure 100 such that upper horizontal surfaces of the metal spacer 122 and the dielectric 118 are coplanar.

Figure 6:
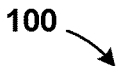
FIG. 6 illustrates a cross-sectional view of the multi-state memory cell and illustrates formation of a layer and a bottom electrode, according to an exemplary embodiment.
Figure 6:
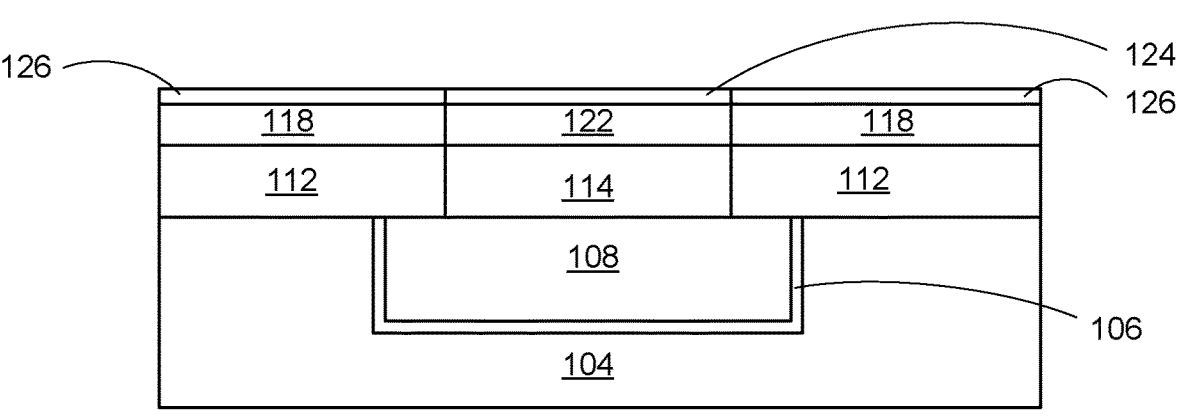

Referring now to FIG. 6, a cross-sectional view of the structure 100 is shown, according to an embodiment. A layer 126 may be formed and a bottom electrode 124 may be formed from a portion of the layer 126.

The layer 126 may include materials such as, for example, titanium (Ti) and conformally formed on the metal spacer 122 and the dielectric 118. The layer 126 may be deposited using typical deposition techniques, for example, physical vapor deposition, atomic layer deposition, molecular layer deposition, and chemical vapor deposition. The layer 126 may be deposited at a high temperature, for example at 400C for 2 minutes. During the high temperature deposition of the layer 126, the material of the layer 126 may react with the dielectric 118 and form titanium dioxide ($TiO_2$) for the layer 126 surrounding the bottom electrode 124. Deposition temperatures of titanium (Ti) as the layer 126 between 350 C and 450 C are applicable as a typical range, although lower or higher deposition temperatures are also contemplated. A typical thickness of the layer 126 may be in the range of 2 nm to 10 nm, although thickness values below 2 nm and above 10 nm are also relevant to this embodiment. The benefit of the layer 126 is a resulting material of the layer 126 deposited at a high temperature reacts with the dielectric 118 and changes to a dielectric material. For example, the layer 126 as titanium reacts with the dielectric 118 as silicon oxide, resulting in the layer 126 as titanium dioxide ($TiO_2$). Any re-sputtering of TiO2 during MTJ stack patterning will not result in any shorts on the MTJ sidewall, since TiO2 is a dielectric material and is not a metal.

The bottom electrode 124 may be vertically aligned with the metal spacer 122, the metal cap 114 and the lower metal wire 108.

The metal spacer 122 provides a spacer material between the bottom electrode 124 and the metal cap 114, such that the metal cap 114 is not modified during the MTJ cell formation process.

Figure 7:
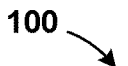
FIG. 7 illustrates a cross-sectional view of the multi-state memory cell and illustrates formation of a reference layer, a tunneling barrier and a free layer, according to an exemplary embodiment.
Figure 7:
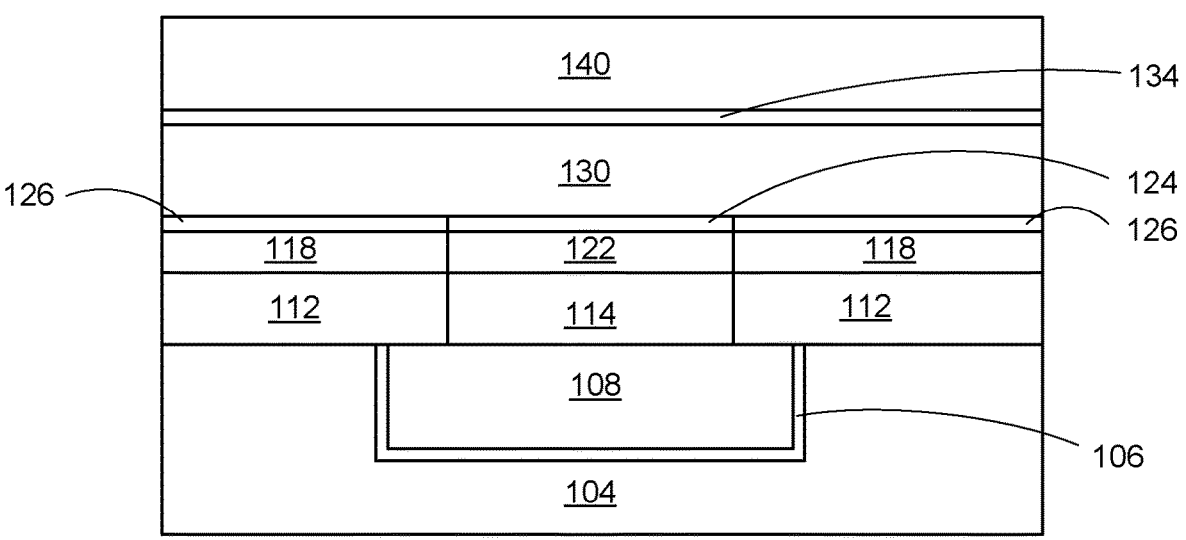

Referring now to FIG. 7, a cross-sectional view of the structure 100 is shown, according to an embodiment. A reference layer 130, a tunneling barrier 134 and a free layer 140 may be formed.

The reference layer 130 may be formed conformally on the structure 100, on upper horizontal surfaces of the bottom electrode 124 and the layer 126. The tunneling barrier 134 may be formed conformally on the structure 100, on an upper horizontal surface of the reference layer 130. The free layer 140 may be formed conformally on the structure 100, on an upper horizontal surface of the tunneling barrier 134.

Figure 8:
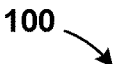
FIG. 8 illustrates a cross-sectional view of the multi-state memory cell and illustrates formation of a hard mask, according to an exemplary embodiment.
Figure 8:
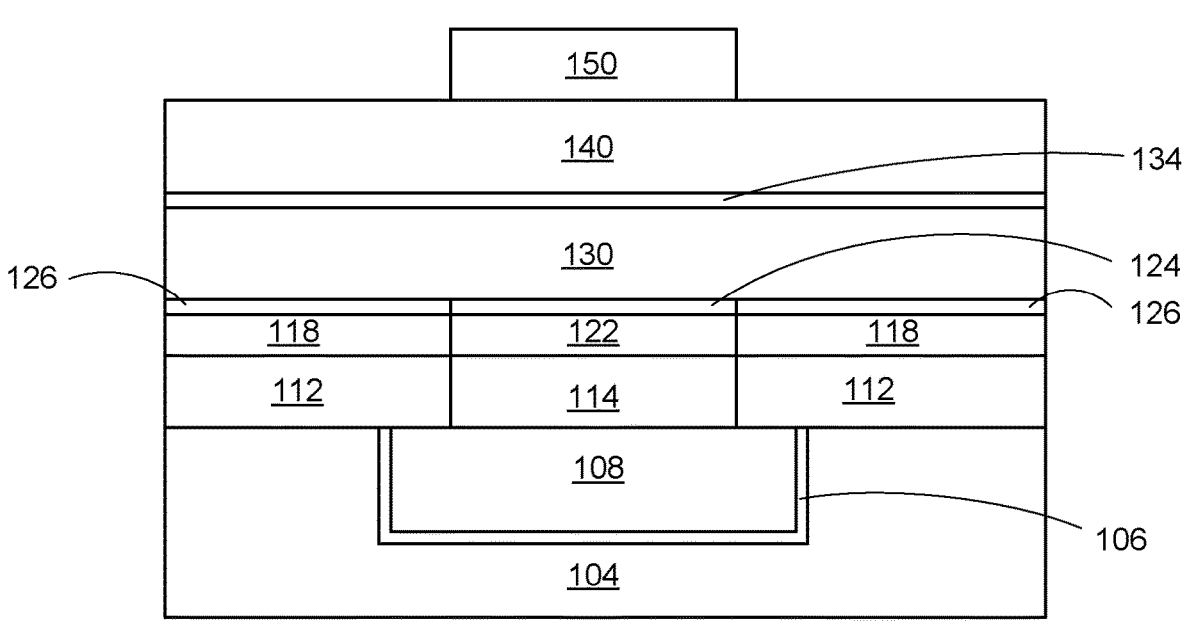

Referring now to FIG. 8, a cross-sectional view of the structure 100 is shown, according to an embodiment. A hard mask 150 may be formed and patterned.

The hard mask 150 may be formed on the free layer 140 using known patterning and etching techniques, removing portions of the hard mask 150, such that remaining portions of the hard mask 150 are vertically aligned above the free layer 140, the tunneling barrier 134, the reference layer 130, the bottom electrode 124, the metal spacer 122, the metal cap 114 and the lower metal wire 108.

The hard mask 150 acts as a mask during patterning of the MTJ stack. The hard mask 150 may include a metal hard mask. After patterning of the MTJ stack, the hard mask 150 may be used as a top electrode. The hard mask 150 functions as a hard mask first, and later as a top electrode.

Figure 9:
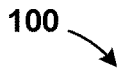
FIG. 9 illustrates a cross-sectional view of the multi-state memory cell and illustrates removal of portions of the reference layer, the tunneling barrier and the free layer, according to an exemplary embodiment.
Figure 9:
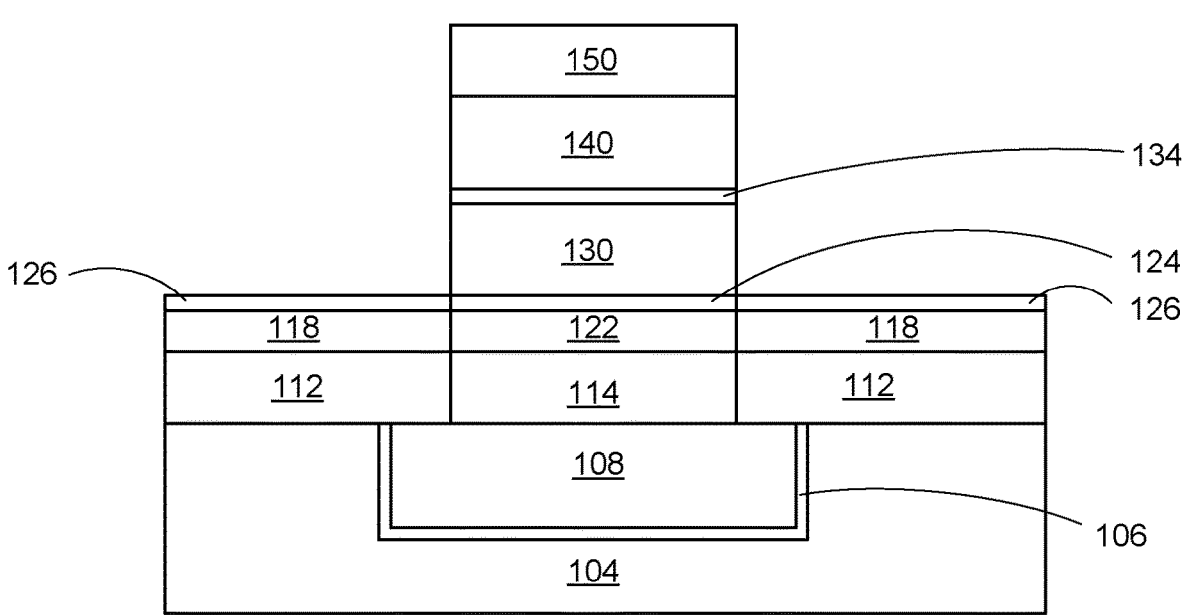

Referring now to FIG. 9, a cross-sectional view of the structure 100 is shown, according to an embodiment. Portions of the reference layer 130, the tunneling barrier 134 and the free layer 140 may be removed.

The portions of the reference layer 130, the tunneling barrier 134 and the free layer 140 may be removed selective to the hard mask 150 and the layer 126. Remaining portions of the reference layer 130, the tunneling barrier 134 and the free layer 140 may have vertically aligned side surfaces above the bottom electrode 124, the metal spacer 122, the metal cap 114 and the lower metal wire 108.

During removal of the portions of the reference layer 130, the tunneling barrier 134 and the free layer 140, any re-sputtering from the layer 126 does not cause metal re-sputtering, since layer 126 is a dielectric material. Any re-sputtering which may occur, would result in dielectric re-sputtering (not metal re-sputtering) and thus not lead to shorts. Thus, no damage from the metal bottom electrode 124 can occur to the reference layer 130, the tunneling barrier 134 and the free layer 140 since the bottom electrode 124 is located only directly underneath the reference layer 130, the tunneling barrier 134 and the free layer 140. The bottom electrode 124 is not exposed and not subject to re-sputtering.

Figure 10:
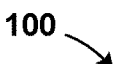
FIG. 10 illustrates a cross-sectional view of the multi-state memory cell and illustrates formation of a dielectric encapsulation layer, according to an exemplary embodiment.
Figure 10:
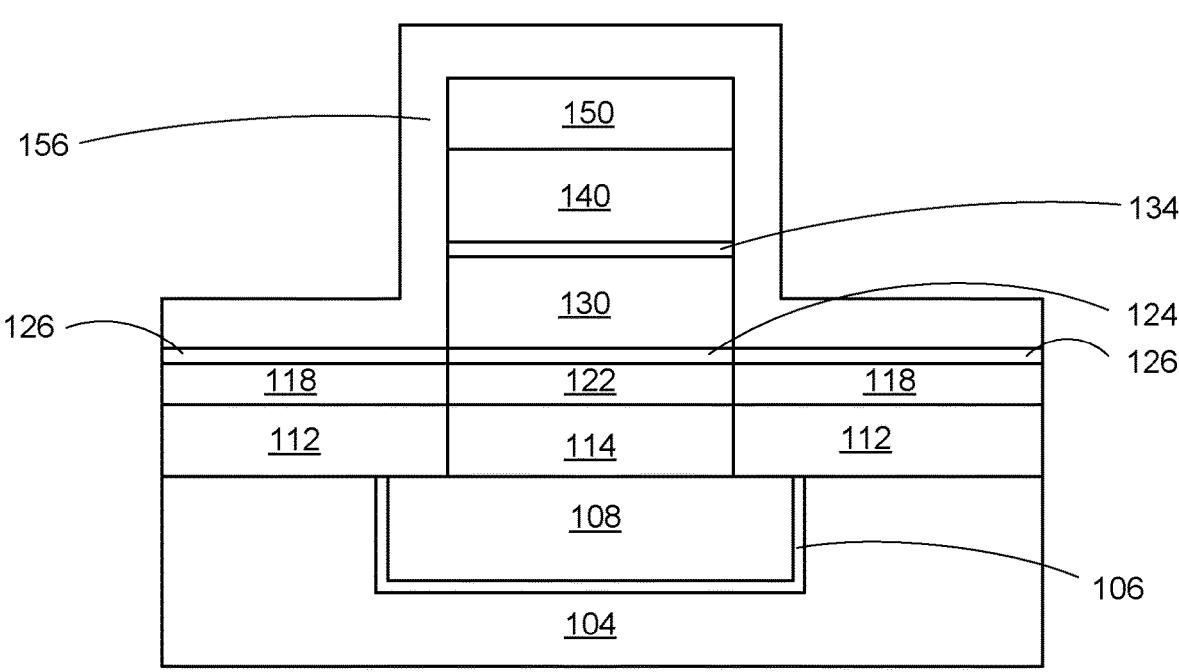

Referring now to FIG. 10, a cross-sectional view of the structure 100 is shown, according to an embodiment. A dielectric encapsulation layer 156 may be formed.

The dielectric encapsulation layer 156 may be formed by depositing or growing a dielectric material. The dielectric encapsulation layer 156 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the dielectric encapsulation layer 156 may include one or more layers. In an embodiment, the dielectric encapsulation layer 156 may include any dielectric material such as silicon nitride (SiNx), silicon boron carbonitride (SiBCN), and silicon carbonitride (SiNC), or any combination thereof or any other suitable dielectric material.

The dielectric encapsulation layer 156 may cover upper horizontal surfaces and vertical side surfaces of the hard mask 150, vertical side surfaces of the free layer 140, the tunneling barrier 134 and the reference layer 130. The dielectric encapsulation layer 156 may cover an upper horizontal surface of the layer 126.

Figure 11:
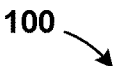
FIG. 11 illustrates a cross-sectional view of the multi-state memory cell and illustrates removal of portions of the dielectric encapsulation layer, according to an exemplary embodiment.
Figure 11:
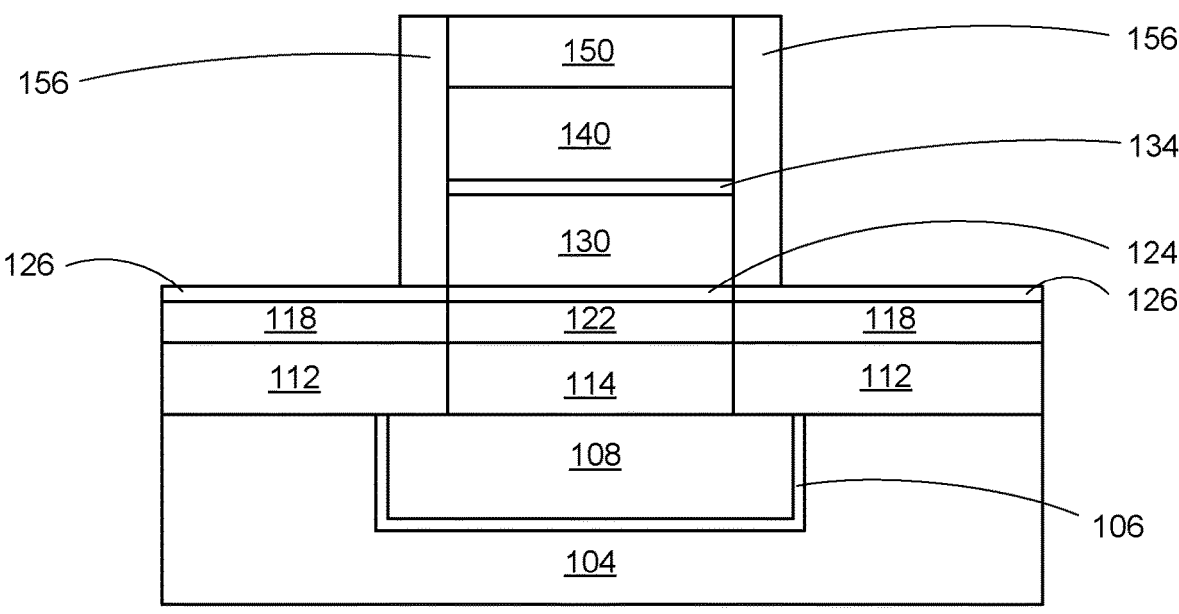

Referring now to FIG. 11, a cross-sectional view of the structure 100 is shown, according to an embodiment. Portions of the dielectric encapsulation layer 156 may be removed.

An anisotropic process, such as reactive ion etch (RIE) or ion beam etch (IBE), may be used to remove the dielectric encapsulation layer 156 from horizontal surfaces of the hard mask 150 and the layer 126. Remaining portions of the dielectric encapsulation layer 156 may remain as side spacers of the MTJ cell, including vertical side surfaces of the hard mask 150, the free layer 140, the tunneling barrier 134 and the reference layer 130.

Figure 12:
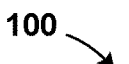
FIG. 12 illustrates a cross-sectional view of the multi-state memory cell and illustrates removal of portions of a layer, according to an exemplary embodiment.
Figure 12:
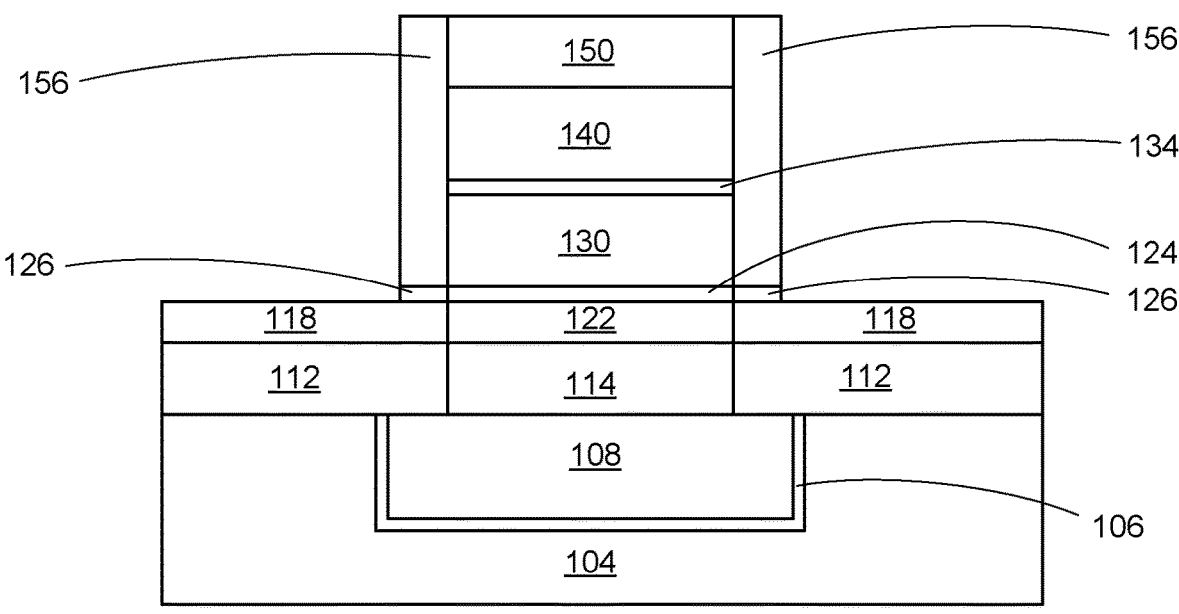

Referring now to FIG. 12, a cross-sectional view of the structure 100 is shown, according to an embodiment. Portions of the layer 126 may be removed.

An anisotropic process, such as reactive ion etch (RIE) or ion beam etch (IBE), may be used to remove the layer 126 from horizontal surfaces of the dielectric 118. Remaining portions of the layer 126 may remain as side spacers of the bottom electrode 124.

Figure 13:
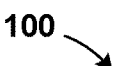
FIG. 13 illustrates a cross-sectional view of the multi-state memory cell and illustrates removal of portions of the dielectric, according to an exemplary embodiment.
Figure 13:
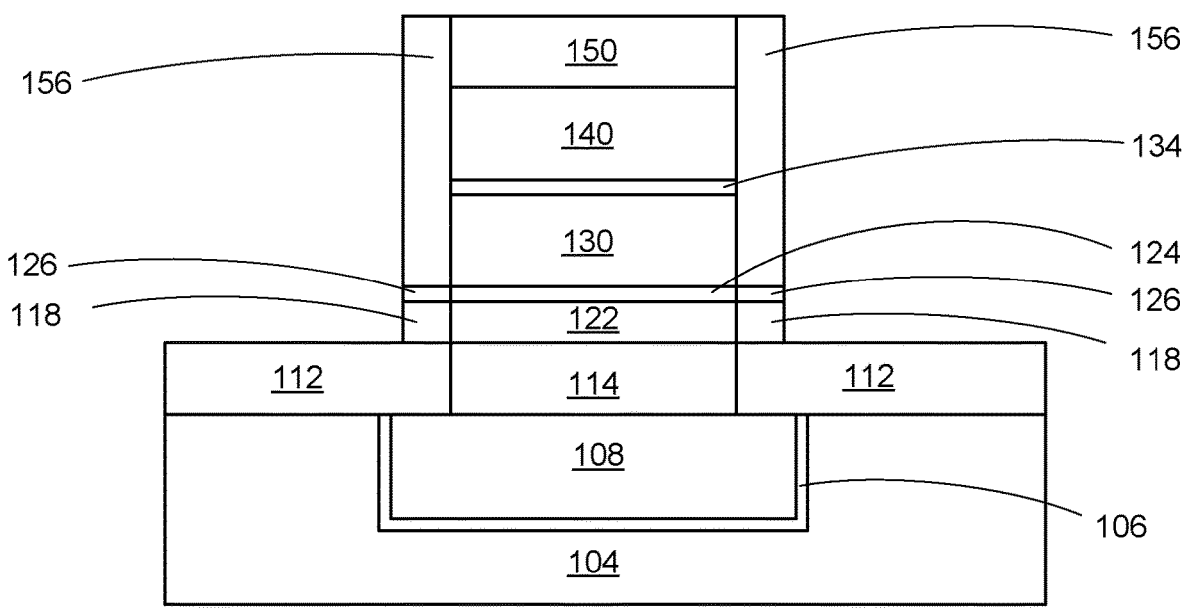

Referring now to FIG. 13, a cross-sectional view of the structure 100 is shown, according to an embodiment. Portions of the dielectric 118 may be removed.

An anisotropic process, such as reactive ion etch (RIE) or ion beam etch (IBE), may be used to remove the dielectric 118 from horizontal surfaces of the dielectric cap 112. Remaining portions of the dielectric 118 may remain as side spacers of the metal spacer 122.

Figure 14:
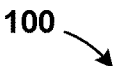
FIG. 14 illustrates a cross-sectional view of the multi-state memory cell and illustrates formation of an inter-layer dielectric, according to an exemplary embodiment.
Figure 14:
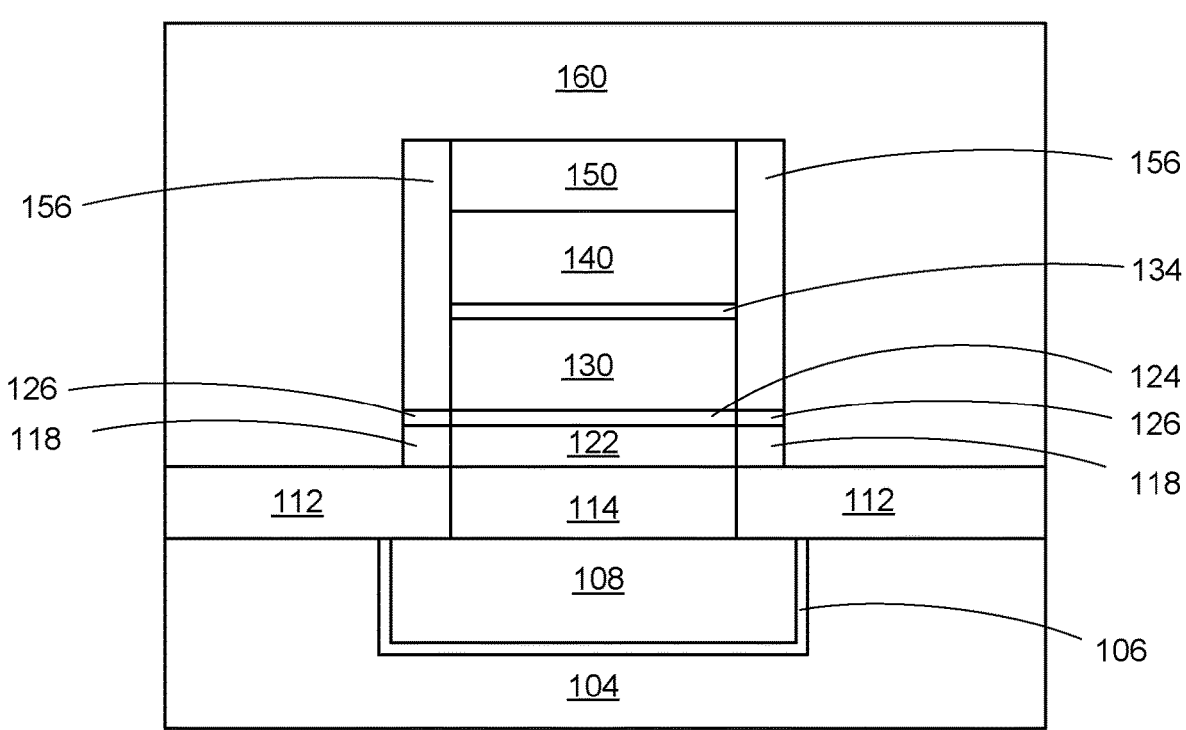

Referring now to FIG. 14, a cross-sectional view of the structure 100 is shown, according to an embodiment. An inter-layer dielectric (hereinafter "ILD") 160 may be formed.

The ILD 160 may be formed as described for the ILD 104. In an embodiment, the ILD 160 may include SiCOH. The ILD 160 may cover upper horizontal surfaces of the hard mask 150, the dielectric encapsulation layer 156 and the dielectric cap 112. The ILD 160 may cover vertical side surfaces of the dielectric encapsulation layer 156, the layer 126 and the dielectric 118.

A planarization process, such as, for example, chemical mechanical polishing (CMP), may be done to remove excess ILD 160 and provide a horizontal upper surface.

Figure 15:
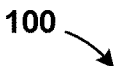
FIG. 15 illustrates a cross-sectional view of the multi-state memory cell and illustrates formation of a trench, according to an exemplary embodiment.
Figure 15:
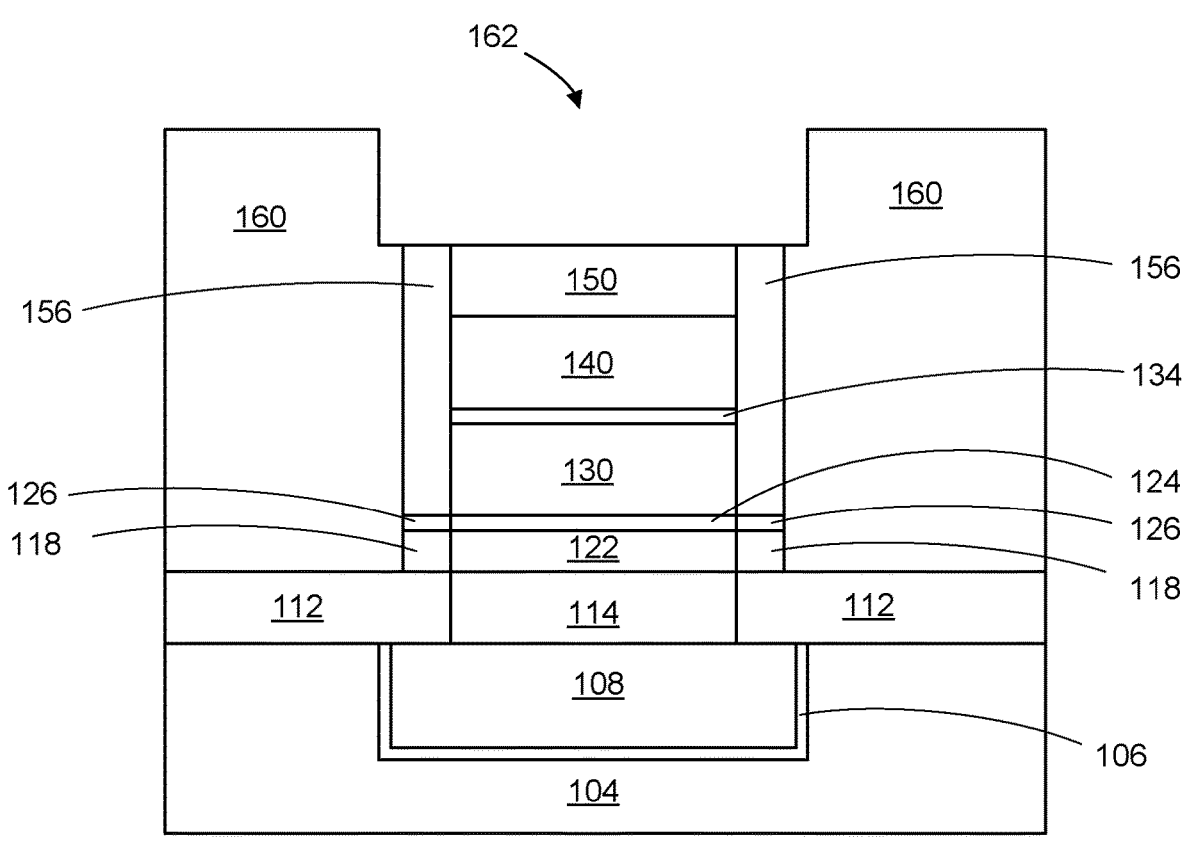

Referring now to FIG. 15, a cross-sectional view of the structure 100 is shown, according to an embodiment. A trench 162 may be formed.

The trench 162 may be formed in the ILD 160 using convention methods, such as patterning a hard mask (not shown) and using a combination of wet/dry etch techniques to remove portions of the ILD 160 and expose upper horizontal surfaces of the hard mask 150 and the dielectric encapsulation layer 156.

Figure 16:
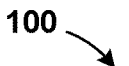
FIG. 16 illustrates a cross-sectional view of the multi-state memory cell and illustrates formation of a liner and an upper metal wire, according to an exemplary embodiment.
Figure 16:
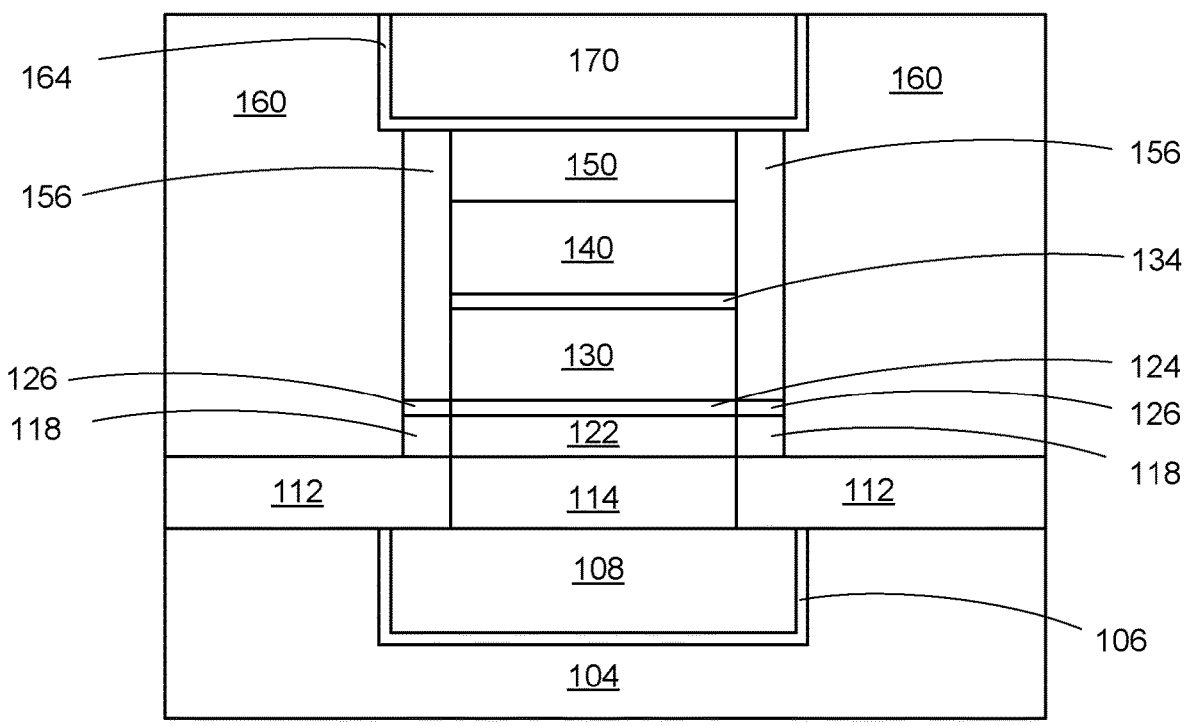

Referring now to FIG. 16, a cross-sectional view of the structure 100 is shown, according to an embodiment. A liner 164 and an upper metal wire 170 may be formed.

The liner 164 and the upper metal wire 170 may be formed in the trench 162. The liner 164 and the upper metal wire 170 may be formed as described for the liner 106 and the lower metal wire 108. A planarization process, such as, for example, chemical mechanical polishing (CMP), may be done to remove excess upper metal wire 170 material and liner 164 material from a top surface of the ILD 160 of the structure 100, such that upper horizontal surfaces of the upper metal wire 170, the liner 164 and the ILD 160 are coplanar.

The liner 164 and the upper metal wire 170 may be vertically aligned above the hard mask 150, the free layer 140, the tunneling barrier 134, reference layer 130, the lower electrode 124 the metal spacer 122, the metal cap 114, and the lower metal wire 108.

The resulting structure 100 was formed with the layer 126 surrounding the bottom electrode 124, preventing the layer 126 from re-sputtering onto the reference layer 130, the tunneling barrier 134, the free layer 140 and the hard mask 150, preventing shorts between the layers when formed into an individual MTJ structure.

Figure 17:
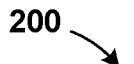
FIG. 17 illustrates a cross-sectional view of a multi-state memory cell, according to another embodiment.
Figure 17:
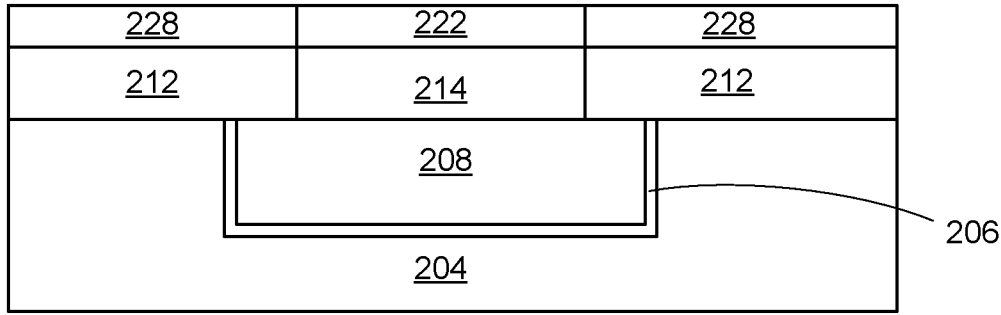

Referring now to FIG. 17, a semiconductor structure 200 (hereinafter "structure") at an intermediate stage of fabrication is shown according to an alternate exemplary embodiment. FIG. 17 is a cross-sectional view of the structure 200. The structure 200 may be formed or provided. The structure 200 includes, for example, an inter-layer dielectric (hereinafter "ILD") 204, a liner 206, a lower metal wire 208, a dielectric cap 212, a metal cap 214, a metal spacer 222 and a dielectric 228.

Similarly named items in the structure 200 may be formed and as described for the structure 100, including the ILD 204, the liner, the lower metal wire 208, the dielectric cap 212, the metal cap 214, the metal spacer 222 and the dielectric 228. The metal spacer 222, the metal cap 214 and the lower metal wire 208 may be vertically aligned. The structure 200 of FIG. 17 may be similar to the structure 100 of FIG. 5.

Figure 18:
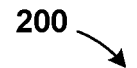
FIG. 18 illustrates a cross-sectional view of the multi-state memory cell and illustrates formation of a bottom electrode, according to an exemplary embodiment.
Figure 18:
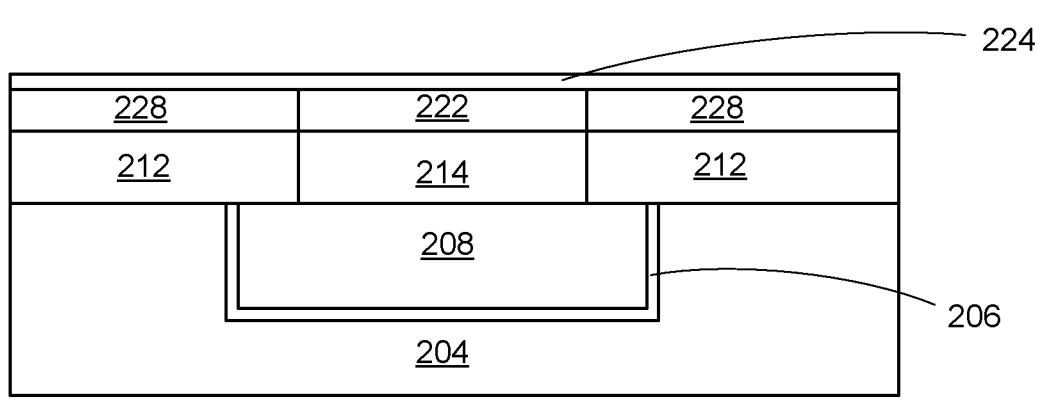

Referring now to FIG. 18, a cross-sectional view of the structure 200 is shown, according to an embodiment. A bottom electrode 224 may be formed.

The bottom electrode 224 may be conformally formed on the structure 200. The bottom electrode 224 may include materials, such as, for example, titanium (Ti) and conformally formed on the metal spacer 222 and the dielectric 218. The bottom electrode 224 may be deposited using typical deposition techniques, for example, physical vapor deposition, atomic layer deposition, molecular layer deposition, and chemical vapor deposition. The bottom electrode 224 may be deposited at a low temperature, for example at 20C. Deposition temperatures of Ti between 0 C and 50 C are applicable as a typical range, although lower or higher deposition temperatures are also contemplated. A typical thickness of the bottom electrode 224 may be in the range of 2 nm to 10 nm, although thickness values below 2 nm and above 10 nm are also relevant to this embodiment. The benefit of the low temperature deposition of a material such as titanium (Ti) used for the bottom electrode 224 on a material such as SiO2 used for the dielectric 228 lies in the transformation of these two materials into one ternary dielectric material. The presence of this ternary dielectric material will ensure that no metal re-sputtering will occur during MTJ patterning.

The bottom electrode 224 of the structure 200 is formed differently than the bottom electrode 124 of the structure 100.

Figure 19:
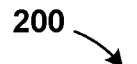
FIG. 19 illustrates a cross-sectional view of the multi-state memory cell and illustrates formation of a blocking layer, according to an exemplary embodiment.
Figure 19:
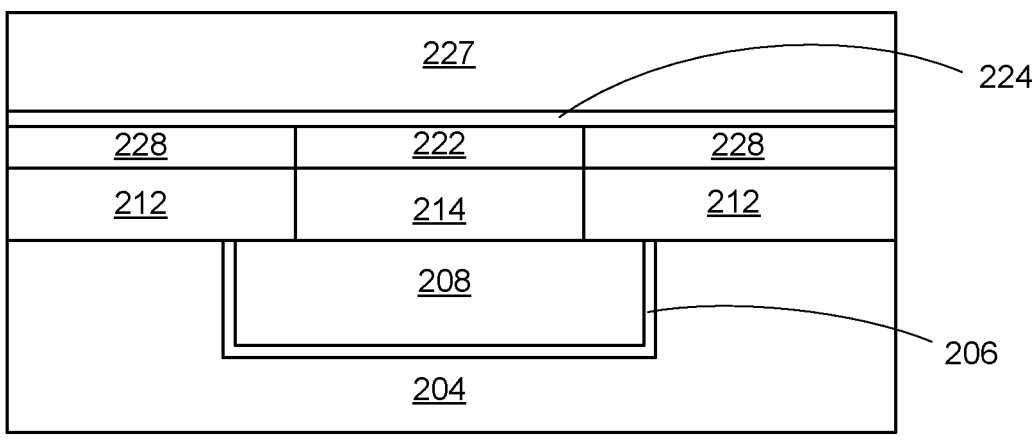

Referring now to FIG. 19, a cross-sectional view of the structure 200 is shown, according to an embodiment. A blocking layer 227 may be formed.

The blocking layer 227 may include materials, such as, for example, tantalum nitride (TaN), and conformally formed on the bottom electrode 224. The blocking layer 227 may be deposited using typical deposition techniques, for example, physical vapor deposition, atomic layer deposition, molecular layer deposition, and chemical vapor deposition.

Figure 20:
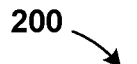
FIG. 20 illustrates a cross-sectional view of the multi-state memory cell and illustrates formation of a ternary oxide layer, according to an exemplary embodiment.
Figure 20:
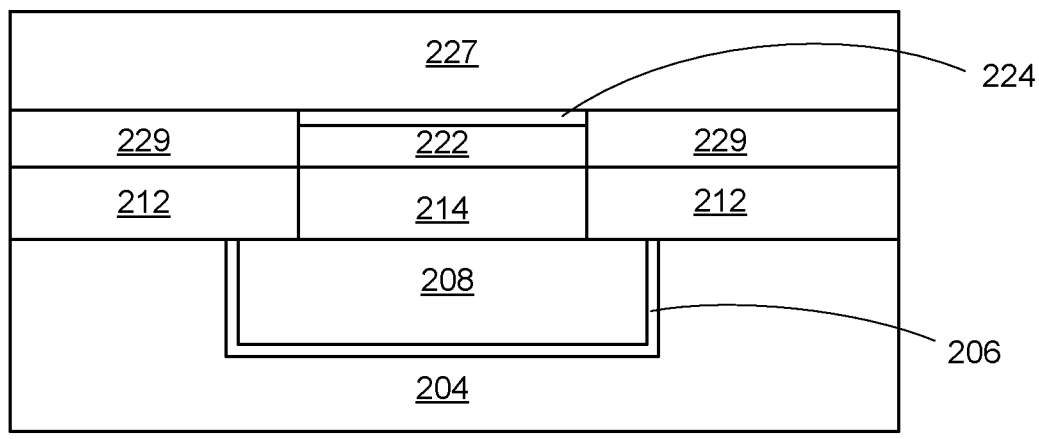

Referring now to FIG. 20, a cross-sectional view of the structure 200 is shown, according to an embodiment. A ternary oxide layer 229 may be formed.

In an embodiment, the dielectric 218 may be silicon dioxide ($SiO_2$) and the bottom electrode may be titanium (Ti). During the high temperature thermal anneal, the portions of the bottom electrode 224 which are adjacent to the dielectric 218 may react with the dielectric 218 and may transform into a combined material of the ternary oxide layer 229. In an embodiment, the ternary oxide layer 229 may be titanium silicon oxide, TiSiOx. In an embodiment, the high temperature thermal anneal may be performed at 400 C for 30 minutes. Anneal temperatures between 350 C and 450 C are applicable as a typical range, although lower or higher deposition temperatures are also contemplated. Anneal durations between 30 minutes and 300 minutes are applicable as a typical range, although shorter or longer durations are also contemplated.

The ternary oxide layer 229 may have an advantage of avoiding any metal re-sputtering during MTJ stack patterning. During the high temperature thermal anneal, the blocking layer 227 may provide protection of the bottom electrode 224 from oxidation.

The remaining portion of the bottom electrode 224 may be aligned with the metal spacer 222, the metal cap 214 and the lower metal wire 208.

Figure 21:
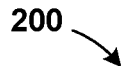
FIG. 21 illustrates a cross-sectional view of the multi-state memory cell and illustrates removal of the blocking layer, according to an exemplary embodiment.
Figure 21:
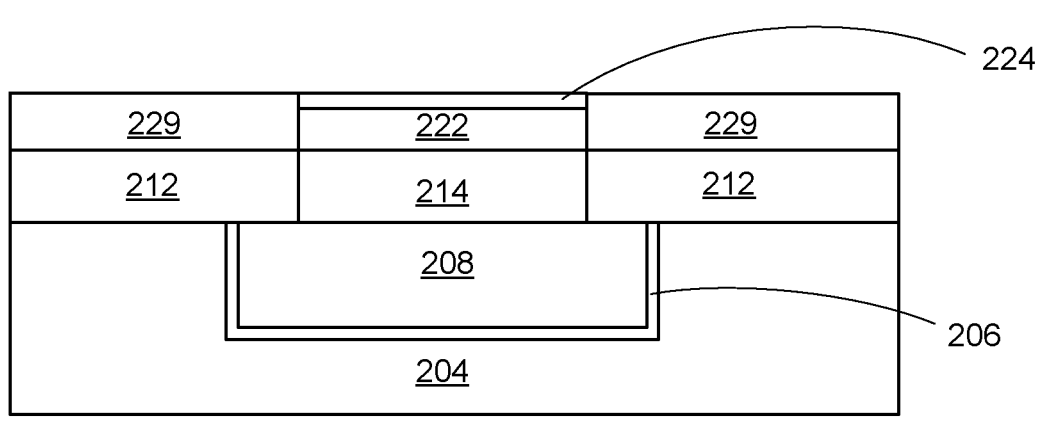

Referring now to FIG. 21, a cross-sectional view of the structure 200 is shown, according to an embodiment. The blocking layer 227 may be removed.

The blocking layer 227 may be removed by methods known in the arts, such as CMP, dry etch or wet etch.

A planarization process, such as, for example, chemical mechanical polishing (CMP), may be done to remove the blocking layer 227 of the structure 200, such that upper horizontal surfaces of the bottom electrode 224 and the ternary oxide layer 229 are coplanar.

Figure 22:
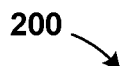
FIG. 22 illustrates a cross-sectional view of the multi-state memory cell and illustrates formation of a reference layer, a tunneling barrier and a free layer, according to an exemplary embodiment.
Figure 22:
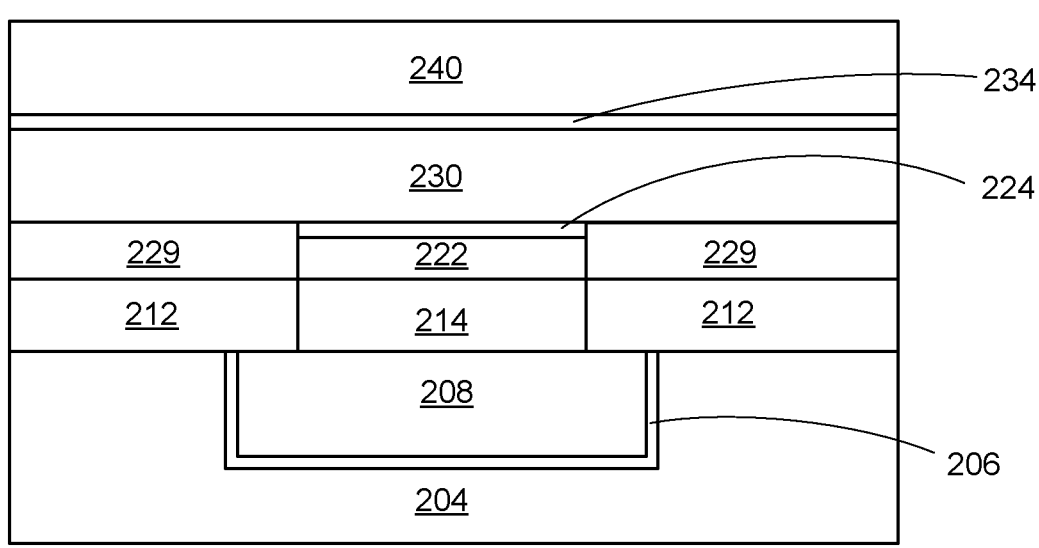

Referring now to FIG. 22, a cross-sectional view of the structure 200 is shown, according to an embodiment. A reference layer 230, a tunneling barrier 234 and a free layer 240 may be formed.

The reference layer 330 may be formed conformally on the structure 200, on upper horizontal surfaces of the bottom electrode 124 and the ternary oxide layer 229. The tunneling barrier 234 may be formed conformally on the structure 200, on an upper horizontal surface of the reference layer 230. The free layer 240 may be formed conformally on the structure 200, on an upper horizontal surface of the tunneling barrier 234.

Figure 23:
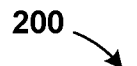
FIG. 23 illustrates a cross-sectional view of the multi-state memory cell and illustrates formation of a hard mask, according to an exemplary embodiment.
Figure 23:
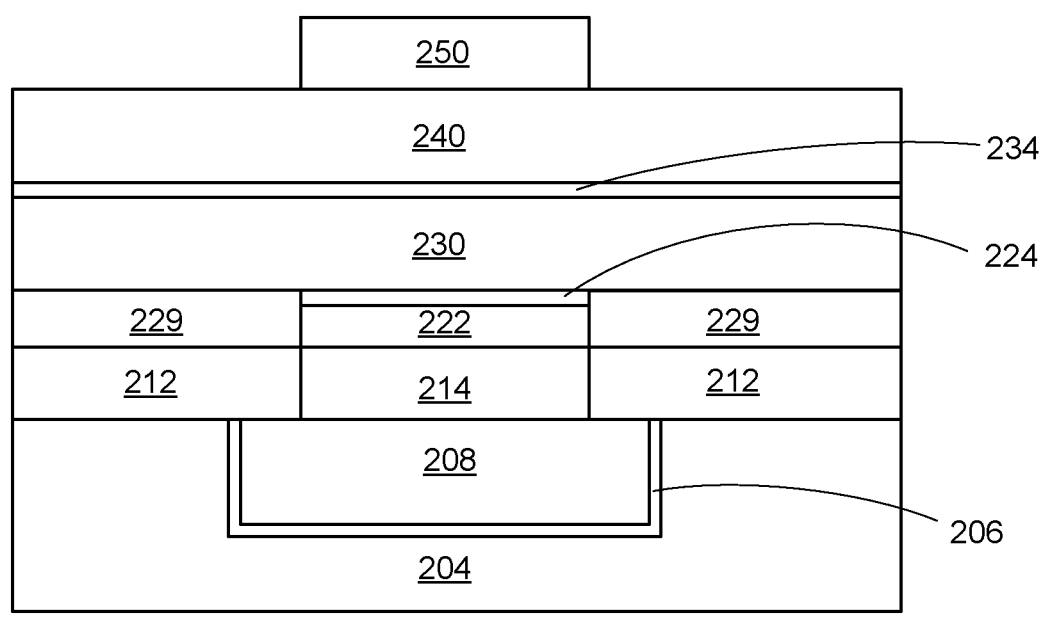

Referring now to FIG. 23, a cross-sectional view of the structure 200 is shown, according to an embodiment. A hard mask 250 may be formed and patterned.

The hard mask 250 may be formed on the free layer 240 using known patterning and etching techniques, removing portions of the hard mask 250, such that remaining portions of the hard mask 250 are vertically aligned above the free layer 240, the tunneling barrier 234, the reference layer 230, the bottom electrode 224, the metal spacer 222, the metal cap 214 and the lower metal wire 208.

The hard mask 250 acts as a mask during patterning of the MTJ stack. The hard mask 250 may include a metal hard mask. After patterning of the MTJ stack, the hard mask 250 may be used as a top electrode. The hard mask 250 functions as a hard mask first, and later as a top electrode.

Figure 24:
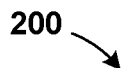
FIG. 24 illustrates a cross-sectional view of the multi-state memory cell and illustrates removal of portions of the reference layer, the tunneling barrier and the free layer, according to an exemplary embodiment.
Figure 24:
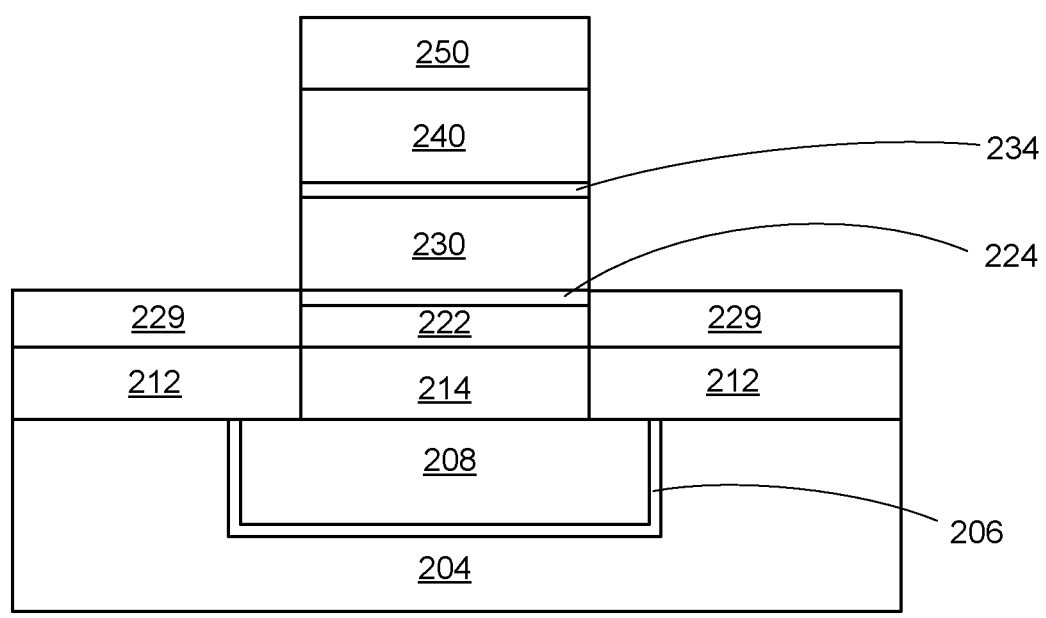

Referring now to FIG. 24, a cross-sectional view of the structure 200 is shown, according to an embodiment. Portions of the reference layer 230, the tunneling barrier 234 and the free layer 240 may be removed.

The portions of the reference layer 230, the tunneling barrier 234 and the free layer 240 may be removed selective to the hard mask 250 and the ternary oxide layer 229. Remaining portions of the reference layer 230, the tunneling barrier 234 and the free layer 240 may have vertically aligned side surfaces above the bottom electrode 224, the metal spacer 222, the metal cap 214 and the lower metal wire 208.

During removal of the portions of the reference layer 230, the tunneling barrier 234 and the free layer 240, any re-sputtering from the ternary oxide layer 229 does not cause metal re-sputtering, since layer 229 is a dielectric material. Any re-sputtering which may occur, would result in dielectric re-sputtering (not metal re-sputtering) and thus not lead to shorts. Thus no damage from the metal bottom electrode 224 can occur to the reference layer 230, the tunneling barrier 234 and the free layer 240 since the bottom electrode 224 is located only directly underneath the reference layer 230, the tunneling barrier 234, and the free layer 240 and is not exposed.

In comparison of the FIG. 100 and the FIG. 200, the ternary oxide layer 229 of the FIG. 200 prevents metal re-sputtering of the bottom electrode 224, while the layer 126 of the FIG. 100 prevents metal re-sputtering of the bottom electrode 124.

Figure 25:
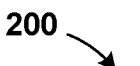
FIG. 25 illustrates a cross-sectional view of the multi-state memory cell and illustrates formation of a dielectric encapsulation layer, according to an exemplary embodiment.
Figure 25:
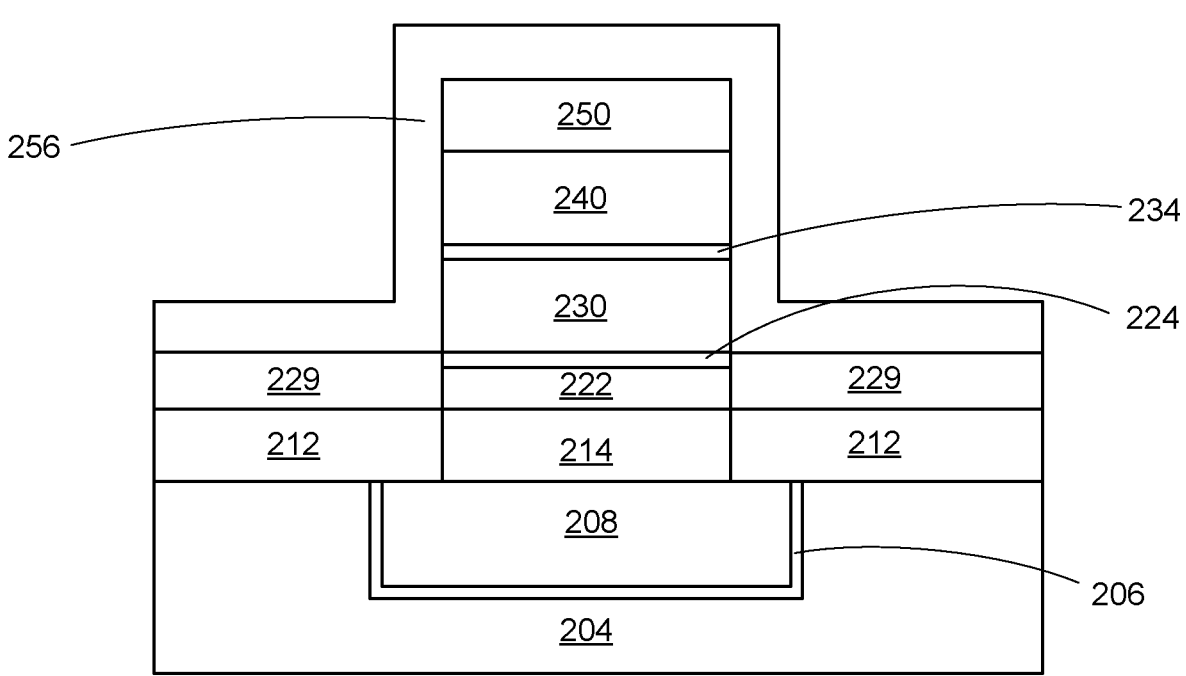

Referring now to FIG. 25, a cross-sectional view of the structure 200 is shown, according to an embodiment. A dielectric encapsulation layer 256 may be formed.

The dielectric encapsulation layer 256 may be formed as described for the dielectric encapsulation layer 156. The dielectric encapsulation layer 256 may cover upper horizontal surfaces and vertical side surfaces of the hard mask 250, vertical side surfaces of the free layer 240, the tunneling barrier 234 and the reference layer 230. The dielectric encapsulation layer 256 may cover an upper horizontal surface of the ternary oxide layer 229.

Figure 26:
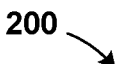
FIG. 26 illustrates a cross-sectional view of the multi-state memory cell and illustrates removal of portions of the dielectric encapsulation layer, according to an exemplary embodiment.
Figure 26:
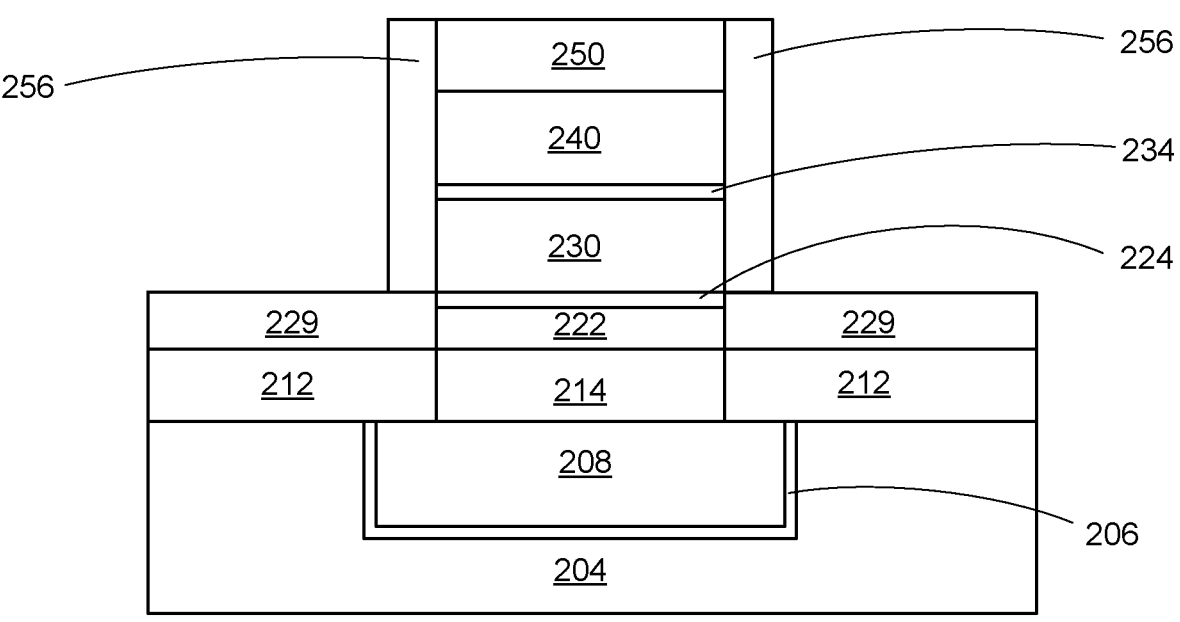

Referring now to FIG. 26, a cross-sectional view of the structure 200 is shown, according to an embodiment. Portions of the dielectric encapsulation layer 256 may be removed.

An anisotropic process, such as reactive ion etch (RIE) or ion beam etch (IBE), may be used to remove the dielectric encapsulation layer 256 from horizontal surfaces of the hard mask 250 and the ternary oxide layer 229. Remaining portions of the dielectric encapsulation layer 256 may remain as side spacers of the MTJ cell, including vertical side surfaces of the hard mask 250, the free layer 240, the tunneling barrier 234 and the reference layer 230.

Figure 27:
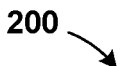
FIG. 27 illustrates a cross-sectional view of the multi-state memory cell and illustrates removal of portions of the ternary oxide layer, according to an exemplary embodiment.
Figure 27:
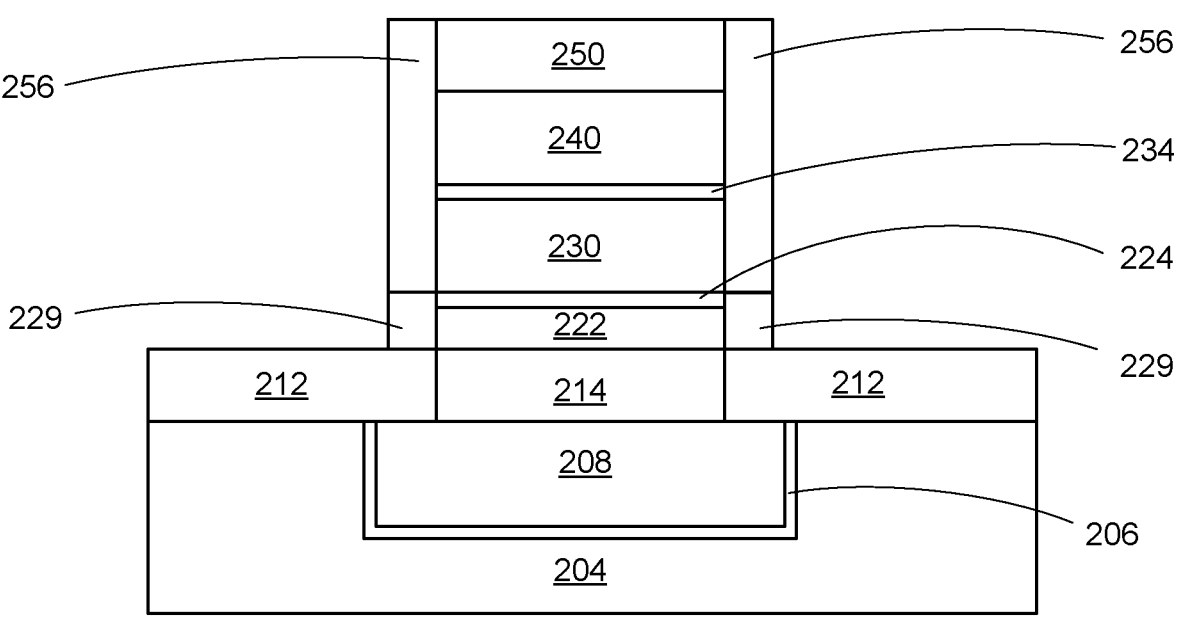

Referring now to FIG. 27, a cross-sectional view of the structure 200 is shown, according to an embodiment. Portions of the ternary oxide layer 229 may be removed.

An anisotropic process, such as reactive ion etch (RIE) or ion beam etch (IBE), may be used to remove the ternary oxide layer 229 from horizontal surfaces of the dielectric cap 212. Remaining portions of the ternary oxide layer 229 may remain as side spacers of the bottom electrode 224 and of the metal spacer 222.

Figure 28:
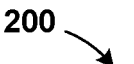
FIG. 28 illustrates a cross-sectional view of the multi-state memory cell and illustrates formation of an inter-layer dielectric, according to an exemplary embodiment.
Figure 28:
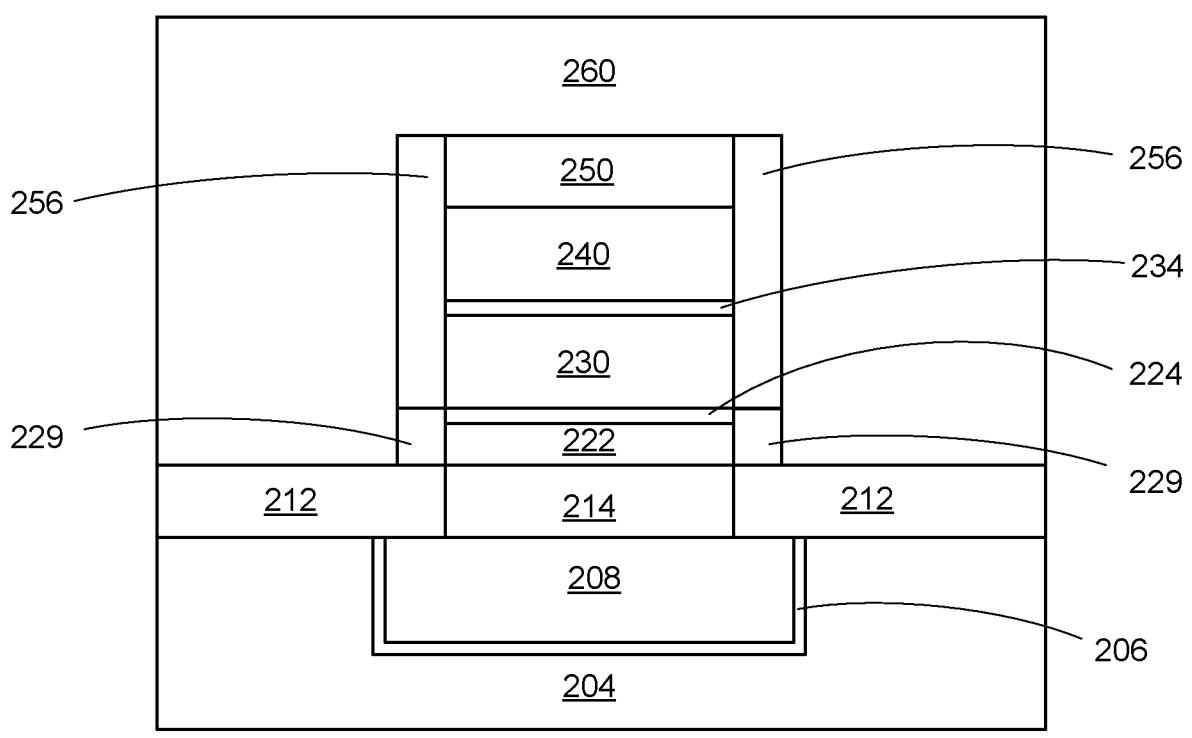

Referring now to FIG. 28, a cross-sectional view of the structure 200 is shown, according to an embodiment. An inter-layer dielectric (hereinafter "ILD") 260 may be formed.

The ILD 260 may be formed as described for the ILD 104. In an embodiment, the ILD 260 may include SiCOH. The ILD 260 may cover upper horizontal surfaces of the hard mask 250, the dielectric encapsulation layer 256 and the dielectric cap 212. The ILD 260 may cover vertical side surfaces of the dielectric encapsulation layer 256 and the ternary oxide layer 229.

A planarization process, such as, for example, chemical mechanical polishing (CMP), may be done to remove excess ILD 260 and provide a horizontal upper surface.

Figure 29:
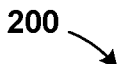
FIG. 29 illustrates a cross-sectional view of the multi-state memory cell and illustrates formation of a trench, according to an exemplary embodiment.
Figure 29:
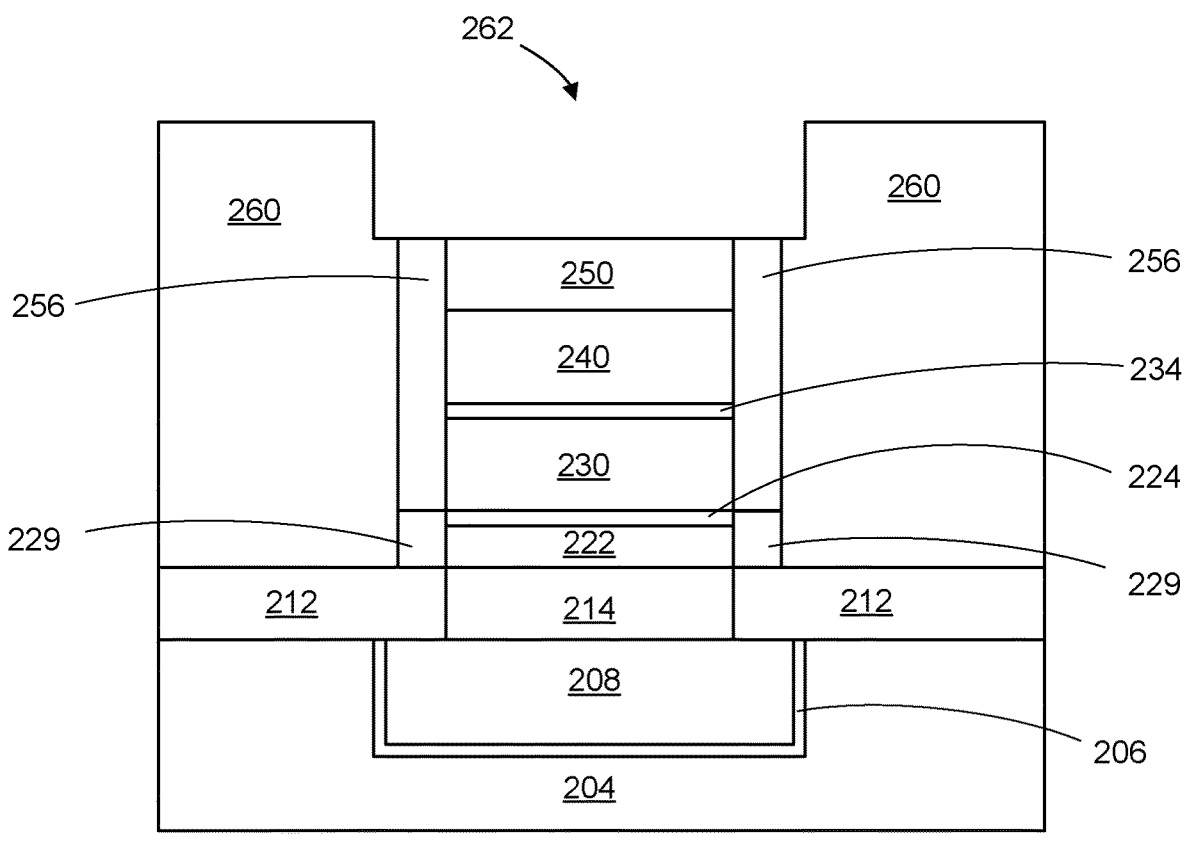

Referring now to FIG. 29, a cross-sectional view of the structure 200 is shown, according to an embodiment. A trench 262 may be formed.

The trench 262 may be formed in the ILD 260 using convention methods, such as patterning a hard mask (not shown) and using a combination of wet/dry etch techniques to remove portions of the ILD 260 and expose upper horizontal surfaces of the hard mask 250 and the dielectric encapsulation layer 256.

Figure 30:
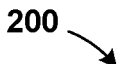
FIG. 30 illustrates a cross-sectional view of the multi-state memory cell and illustrates formation of a liner and an upper metal wire, according to an exemplary embodiment.
Figure 30:
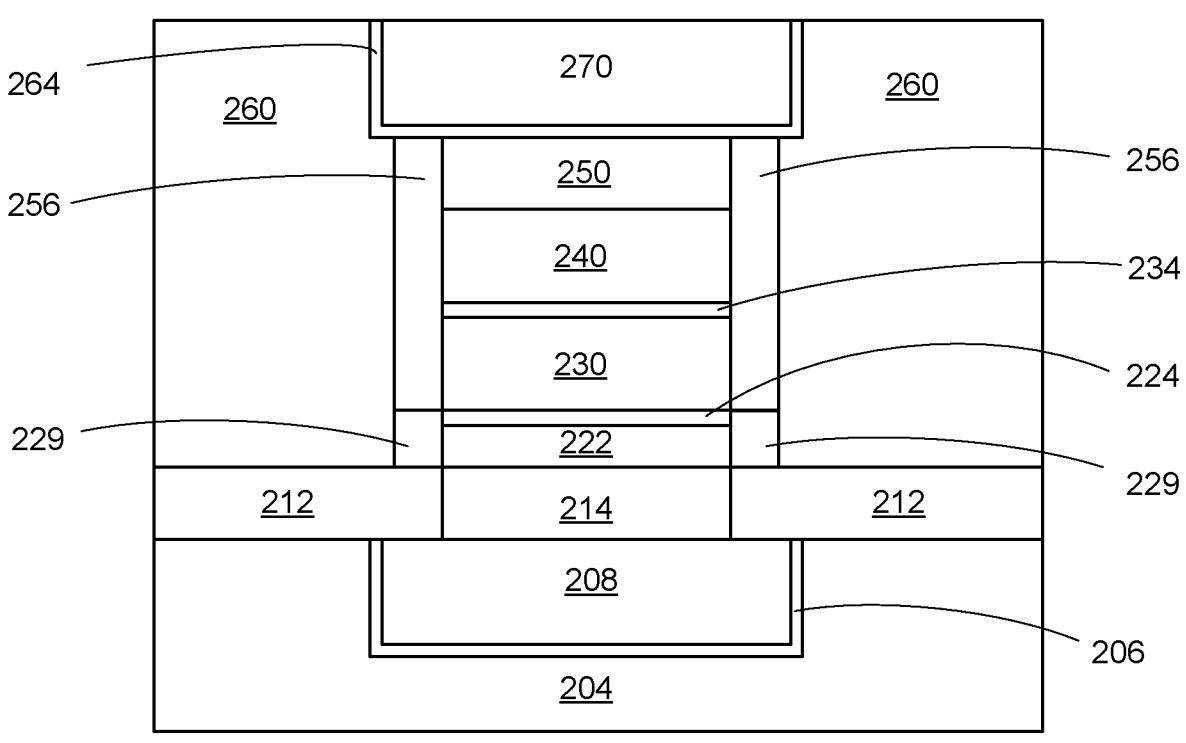

Referring now to FIG. 30, a cross-sectional view of the structure 200 is shown, according to an embodiment. A liner 264 and an upper metal wire 270 may be formed.

The liner 264 and the upper metal wire 270 may be formed in the trench 262. The liner 264 and the upper metal wire 270 may be formed as described for the liner 106 and the lower metal wire 108. A planarization process, such as, for example, chemical mechanical polishing (CMP), may be done to remove excess upper metal wire 270 material and liner 264 material from a top surface of the ILD 260 of the structure 200, such that upper horizontal surfaces of the upper metal wire 270, the liner 264 and the ILD 260 are coplanar.

The liner 264 and the upper metal wire 270 may be vertically aligned above the hard mask 250, the free layer 240, the tunneling barrier 234, reference layer 230, the lower electrode 224 the metal spacer 222, the metal cap 214, and the lower metal wire 208.

The resulting structure 200 was formed with the ternary oxide layer 229 surrounding the bottom electrode 224, preventing the bottom electrode 226 from re-sputtering onto the reference layer 230, the tunneling barrier 234, the free layer 240 and the hard mask 250, preventing shorts between the layers when formed into an individual MTJ structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
a magnetic tunnel junction (MTJ) stack,
wherein a vertical side surface of a bottom electrode of the MTJ stack is surrounded by a metal oxide, and wherein the bottom electrode and the metal oxide are horizontally aligned, wherein both the bottom electrode and the metal oxide comprise a same metal element.

2. The semiconductor device according to claim 1, further comprising:
a metal spacer directly below and vertically aligned to the bottom electrode, wherein a vertical side surface of the metal spacer is surrounded by a dielectric, and wherein the dielectric and metal oxide are vertically aligned.

3. The semiconductor device according to claim 2, further comprising:

a side spacer surrounding sidewalls of a reference layer, a tunneling barrier layer and a free layer of the MTJ stack, wherein a width of the side spacer is equal to a width of the metal oxide.

4. The semiconductor device according to claim 2, wherein the dielectric comprises silicon oxide ($SiO_2$).

5. The semiconductor device according to claim 1, wherein the metal oxide comprises titanium oxide ($TiO_2$).

6. The semiconductor device according to claim 1, wherein the bottom electrode comprises titanium (Ti).

7. A semiconductor device comprising:
a magnetic tunnel junction (MTJ) stack comprising a metal spacer below a bottom electrode,
wherein sidewalls of the bottom electrode are surrounded by a titanium silicon oxide (TiSiOx),
wherein an upper surface of the bottom electrode is horizontally aligned with an upper surface of the titanium silicon oxide (TiSiOx), and
wherein a lower surface of the metal spacer is horizontally aligned with a lower surface of the titanium silicon oxide (TiSiOx).

8. The semiconductor device according to claim 7, further comprising:
a side spacer surrounding sidewalls of a reference layer, a tunneling barrier layer and a free layer of the MTJ stack, wherein the side spacer is vertically aligned with the titanium silicon oxide (TiSiOx).

9. The semiconductor device according to claim 8, wherein the side spacer comprises silicon nitride (SiN).

10. The semiconductor device according to claim 7, further comprising:
a side spacer surrounding sidewalls of a reference layer, a tunneling barrier layer and a free layer of the MTJ stack, wherein a width of the side spacer is equal to a width of the titanium silicon oxide (TiSiOx).

11. The semiconductor device according to claim 7, wherein the bottom electrode comprises titanium (Ti).

12. A method comprising:
forming a metal spacer above and vertically aligned with a lower metal line, wherein the metal spacer is surrounded by a dielectric;
forming a metal layer directly on both the metal spacer and the dielectric; and
annealing the metal layer to form a metal oxide on the dielectric, wherein the metal oxide is horizontally aligned with the metal layer.

13. The method according to claim 12, further comprising:
forming a reference layer on the metal layer and on the metal oxide;
forming a tunnel barrier on the reference layer;
forming a free layer on the tunnel barrier; and
removing vertically aligned portions of the reference layer, the tunnel barrier and the free layer without re-sputtering of the metal layer.

14. The method according to claim 13, further comprising:
forming side spacers surrounding the reference layer, the tunnel barrier and the free layer, wherein the side spacers are above and directly contact the metal oxide.

15. The method according to claim 14, further comprising:
removing portions of the metal oxide, wherein a width of a remaining portion of the metal oxide is equal to a width of one of the side spacers.

16. The method according to claim 15, further comprising:

removing portions of the dielectric, wherein a width of a remaining portion of the dielectric is equal to the width the remaining portion of the metal oxide.

17. The method according to claim 15, further comprising:

forming a top electrode on the free layer; and forming an upper metal line on the top electrode.

18. The method according to claim 12, wherein the metal layer comprises titanium (Ti).

19. The method according to claim 12, wherein the dielectric comprises silicon oxide ($SiO_2$).

20. The method according to claim 12, wherein the metal oxide comprises titanium oxide ($TiO_2$).

\* \* \* \* \*